United States Patent [19]

Cooper

[11] 4,456,974
[45] Jun. 26, 1984

[54] MAGNETIC BUBBLE DEVICE

[75] Inventor: Paul V. Cooper, Kingsley, England

[73] Assignee: Plessey Overseas Limited, Ilford, England

[21] Appl. No.: 330,442

[22] Filed: Dec. 14, 1981

Related U.S. Application Data

[63] Continuation of Ser. No. 127,413, Mar. 5, 1980, abandoned.

[30] Foreign Application Priority Data

Dec. 7, 1979 [GB] United Kingdom ................. 7942304

[51] Int. Cl.$^3$ ............................................. G11C 19/08
[52] U.S. Cl. ............................................ 365/2; 365/1; 365/28; 324/210
[58] Field of Search ........................... 365/1, 2, 27, 28; 324/210

[56] References Cited

U.S. PATENT DOCUMENTS

| | | | |
|---|---|---|---|
| 4,045,786 | 8/1977 | Lee et al. ............................... | 365/6 |
| 4,158,811 | 6/1979 | Li et al. ................................. | 365/2 |
| 4,160,274 | 7/1979 | Stephenson, Jr. et al. ............. | 365/2 |
| 4,213,091 | 7/1980 | Cooper .................................. | 365/2 |

FOREIGN PATENT DOCUMENTS

| | | | |
|---|---|---|---|
| 32208 | 7/1981 | European Pat. Off. ................. | 365/2 |
| 2032699 | 12/1982 | United Kingdom ..................... | 365/2 |

OTHER PUBLICATIONS

IEEE Transactions on Magnetics-vol. Mag.-13 No. 5, Sep. 1977, pp. 1370-1372.

Primary Examiner—James W. Moffitt
Attorney, Agent, or Firm—Fleit, Jacobson, Cohn & Price

[57] ABSTRACT

The specification describes a magnetic bubble device which incorporates a Z coil for providing a test magnetic field in addition to the usually provided bias field. In order to reduce package size the Z coil comprises at least one printed coil 17 formed on a substrate 15. The substrate 15 may be a flexible substrate such as polyimide film which is provided as a flap on a chip connection substrate formed from the same film, the flap folding over to lie parallel with the chip connection substrate.

The invention enables a Z coil to be provided within a package without unduly increasing package height and provides an additional advantage that the substrate which supports the Z coil may be used to protect the magnetic bubble device chip.

16 Claims, 4 Drawing Figures

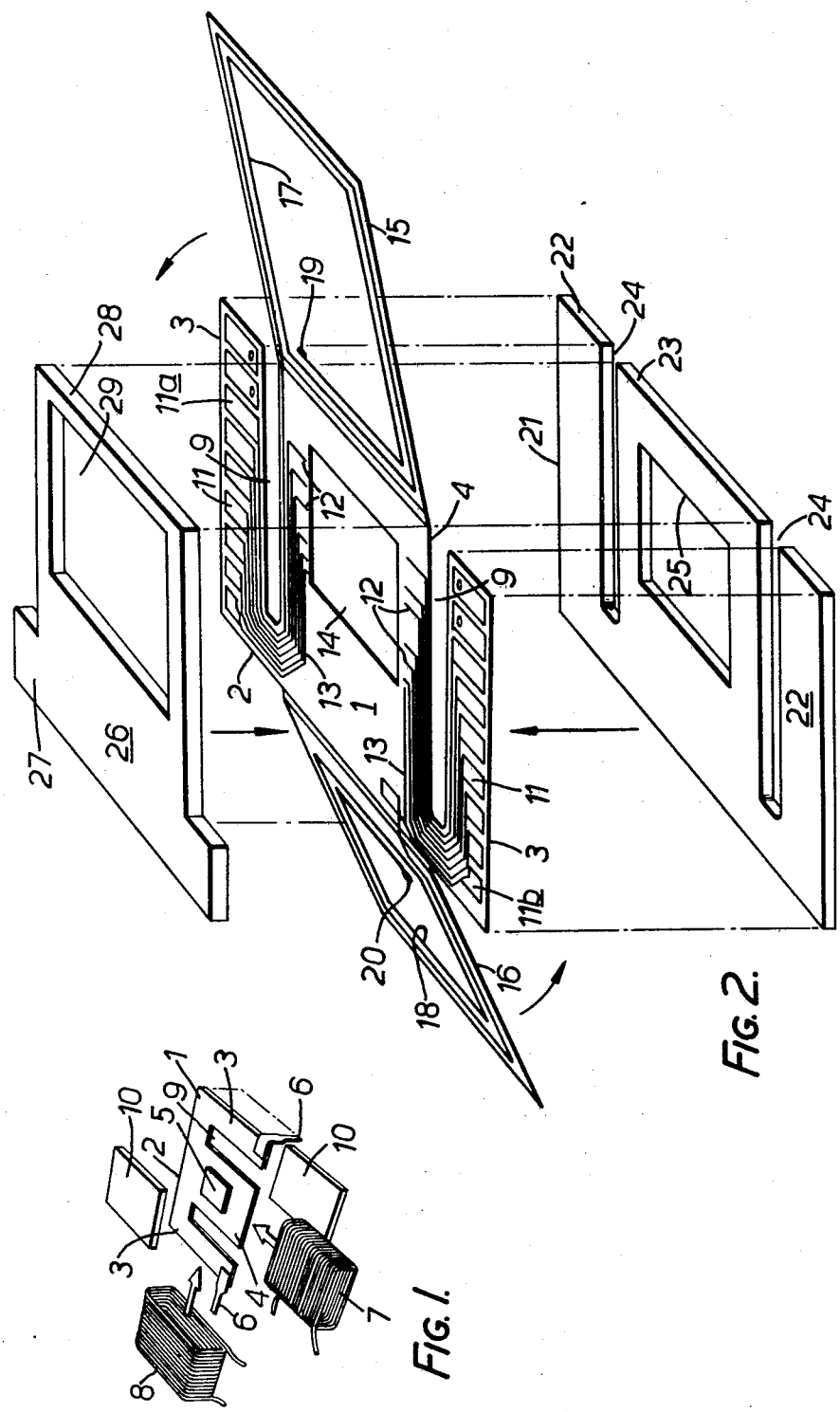

MAGNETIC BUBBLE DEVICE

This is a continuation of application Ser. No. 127,413, filed Mar. 5, 1980, now abandoned.

This invention relates to magnetic bubble devices. Such devices are well known and include a chip of material capable of supporting magnetic bubbles.

In order to support magnetic bubbles it is necessary for a magnetic field, known as the bias field, to be provided across the device chip and the field strength of this bias field must be set to a value in a range between upper and lower limits.

The entire magnetic bubble device is encapsulated within a shield and in order to test the device and set the bias field, a so-called Z coil has been incorporated into the shield, to provide an adjustable magnetic field across the chip during testing and setting of the bias field.

A problem with the use of a Z coil is that, since the coil must be located within the shield, the overall size of the package has to be increased.

This is undesirable, and presents a particularly severe problem in the production of devices having a large information storage capability, e.g. 256K bits, where undesirably large packages can result.

An alternative known device provides the shield with slots so that after encapsulation coils may be inserted whilst the bias field is set. This presents problems with providing satisfactory encapsulation of the device and also increases package size since extra package space must be provided to accommodate the slots. Also a complex test head is required in order to insert coils around appropriate limbs of the shield.

It is possible to set the bias field without the use of a Z coil and a suitable method is described in our co-pending patent application Ser. No. 906,623, now U.S. Pat. No. 4,213,091. A problem with the method of the co-pending application is its lack of flexibility of testing procedure.

The method only allows the bias field to be set to the centre of its range. It is not possible to perform useful tests with differing selected settings of the bias field e.g. towards one end of its range. Further the testing procedure is more complex with the method described in the co-pending application than would be the case were Z coils to be used.

This invention seeks to provide a bubble memory device which includes a Z coil within the shield and in which the problem of having to increase the package size is at least mitigated.

According to this invention there is provided a magnetic bubble device including a chip of material capable of supporting magnetic bubbles; means for providing a bias field across the chip, and a Z coil for superimposing a test magnetic field on to the bias field, the Z coil being formed as a printed coil on a substrate.

In an embodiment the substrate is a flexible film substrate.

The flexible film substrate may be polyimide film.

The coil may be printed on both sides of the substrate, electrical connection being made between printed tracks on each side.

A chip connection substrate may be provided for enabling electrical connection to be made to the chip from a plurality of electrical terminals.

The chip connection substrate may be generally E-shaped having end limbs each spaced from a centre limb the end limbs and centre limb extending outwardly from a rear edge of the E-shaped substrate.

Printed tracks may be provided on the connection substrate to extend between conductive contact pads provided on at least one of the end limbs, to electric contacts provided on the centre limb, electrical connection being made between the chip and the contacts on the centre limb.

The chip connection substrate may be provided with an aperture in the centre limb for accommodating the chip.

The chip connection substrate may be formed from a flexible film substrate which may be polyimide film.

The Z coil may be formed upon a flexible film substrate which is common with the flexible film connection substrate.

The coil may be formed upon a flap extending outwardly from the connection substrate and arranged to fold back so as to lie in operation substantially parallel to the connection substrate.

The coil may be formed upon two flaps which extend outwardly from opposing edges of the connection substrate electrical connection being made between printed tracks on the two flaps each flap being arranged to fold back so as to lie in operation parallel to the connection substrate.

The two flaps may fold back towards opposing surfaces of the connection substrate.

One flap may extend outwardly from the centre limb of the E-shaped substrate whilst the other flap of the two flaps may extend outwardly from the opposing rear edge of the substrate.

An examplary embodiment of the invention will now be described with reference to the drawings in which:

FIG. 1 shows a known magnet bubble device,

FIG. 2 is an exploded perspective view of part of a magnetic bubble device in accordance with this invention.

Figure 3:
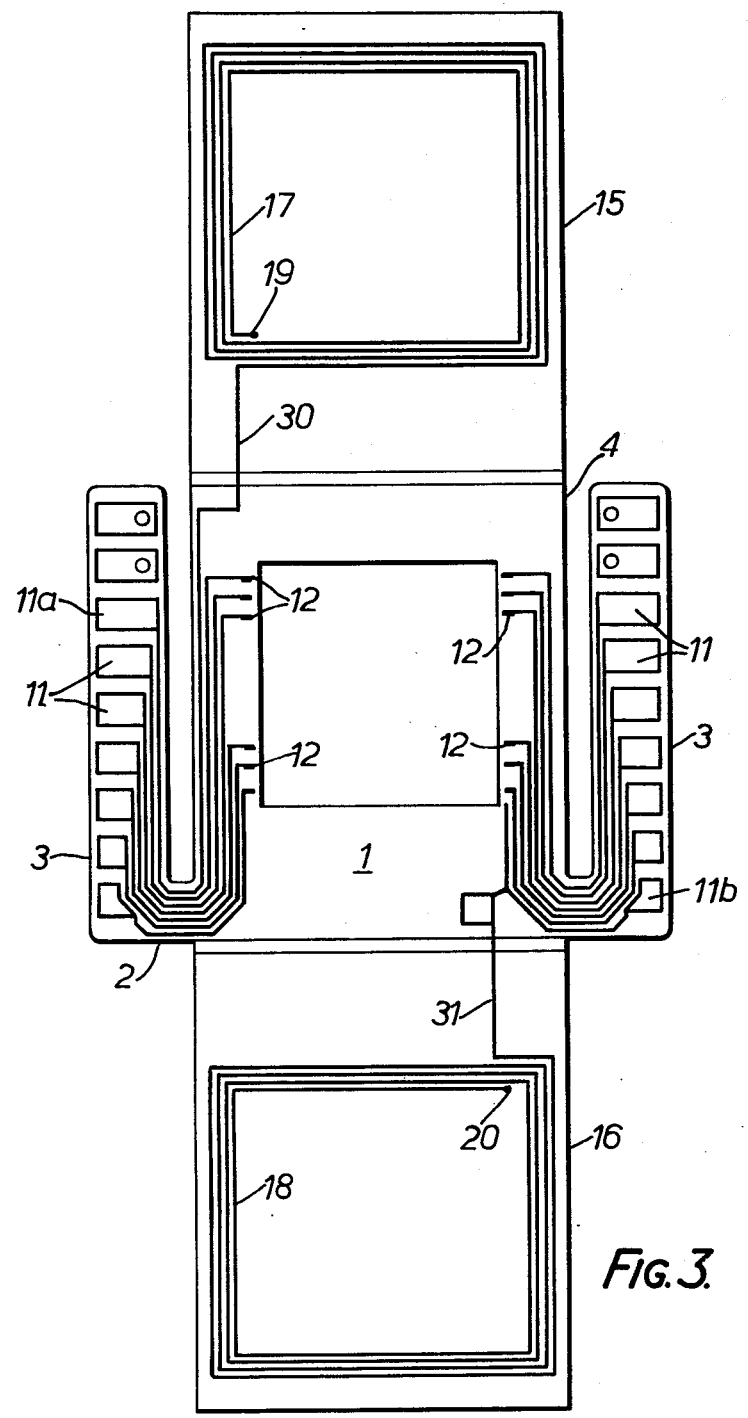
FIGS. 3 and 4 are plan views of opposing sides of the flexible film substrate shown in FIG. 2.

Referring to FIG. 1 the magnetic bubble device shown comprises an E-shaped chip connection substrate 1 having a rear edge 2 from which extend outwardly a pair of end limbs 3 and a centre limb 4. The centre limb 4 supports a chip of material 5 capable of supporting magnetic bubbles, whilst the end limbs 3 carry contact pads (not shown) to which are connected terminals 6 by means of which the magnetic bubble device is connected to necessary external supplies and other components. The chip 5 is electrically coupled to the terminals 6 by means of printed tracks which extend from the centre limb 4 to the contact pads provided on the end limbs 3.

In order to provide the necessary rotating magnetic field in the plane of the chip 5, orthogonally disposed electrical coils 7 and 8 are provided. The centre limb 4 of the substrate 1 is separated from the end limbs 3 by means of slots 9 and the coil 7 slides over the centre limb along the slots 9 until it surrounds the chip 5. The coil 8 then slides over the whole substrate 1 orthogonally to the coil 8 until it also surrounds both the chip 5 and the coil 7.

It is also necessary to provide a bias magnetic field across the device chip and therefore the assembled substrate 1 and coils 7 and 8 are sandwiched between a pair of permanently biased magnets 10. The assembled device is usually encapsulated within a magnetic shield from which the terminals 6 extend.

As so far described the magnetic bubble device is well known and as explained above in order to produce a test magnetic field which superimposes on to the field provided by the bias magnets 10 a Z coil has been provided within the magnetic shield which surrounds the device. In known magnetic bubble devices the inclusion of the Z coil has resulted in a significant increase in the size of the package.

Referring now to FIG. 2 of the drawings there is shown part of a magnetic bubble device in accordance with this invention.

In FIG. 2 where parts similar to those in FIG. 1 bear like reference numerals the connection substrate 1 is now formed from flexible polyimide film substrate sold commerically as "KAPTON". The end limbs 3 of the E-shaped substrate 1 have a number of printed contact pads 11 whilst the centre limb 4 is provided with electrical contacts 12 located towards each edge of the centre limb 4 which is adjacent the slots 9. Each of the electrical contacts 12 is connected to a respective one of the contact pads 11 by means of a respective one of printed tracks 13 which pass between the closed end of the slots 9 and the rear edge 2 of the substrate 1. The centre limb 4 has a rectangular aperture 14 extending between the sets of electrical contacts 12 and this aperture accommodates the device chip 5 so that it lies co-planar with the substrate 1, electrical contact being made between the chip 5 and the electrical contacts 12 by means of bonding wire.

Extending outwardly in opposing directions from the centre limb 4 and the rear edge 2 of the substrate 1 are flaps 15 and 16 which are also formed from KAPTON film and which form a common film substrate with the connection substrate 1. The KAPTON film is typically 1 thousandth of an inch thick.

In order to provide a Z coil for testing purposes the flaps 15 and 16 carry on each side of the KAPTON film printed coils 17 and 18 respectively. The printed coil 17 on one side of the flap 15 is connected to the corresponding coil on the other side of that flap by means of a plated through connection 19 whilst a similar plated through connection 20 connects the coil 17 on one side of the flap 15 with the corresponding coil on the other side of that flap 15. A printed track extends on the reverse side of the KAPTON film from that shown in this Figure and interconnects the coil 17 with the coil 18 so that the two coils effectively form a single coil.

The electrical connection to the Z coil is provided by a printed track connection extending between the coil 17 provided on the flap 15 and pad 11a of the contact pads 11 whilst the Z coil is terminated at a contact pad referenced 11b which makes electrical contact by means of a printed track with the coil 18 provided on the flap 16.

In a completed bubble memory device the substrate 1 is arranged to sit on a spacer member 21 which is substantially identical in shape to the E-shaped connection substrate and has end limbs 22 separated from a centre limb 23 by means of slots 24, the centre limb 23 having a rectangular aperture 25 corresponding to the aperture 14 provided in the centre limb 4 of the connection substrate 1. The connection substrate 1 is arranged to sit on the spacer member 21 so that their respective E-shapes are aligned with one another and the flap 16 is then folded underneath the spacer 21 so that it lies close to and parallel with that spacer.

The folded under flap 16 then acts as a support for the chip 5 which sits on the flap 16 within the apertures 14 and 25 and is connected to the electrical contacts 12 by means of bonding wire.

A further T-shaped spacer member 26 is then arranged to sit on top of the E-shaped connection substrate 1. The T-shaped spacer 26 comprises a cross member 27 which overlies the substrate 1 between the closed end of the slots 9 and the rear edge 2 of that substrate.

A limb 28 of the T-shaped spacer 26 extends orthogonally outwardly from the cross member 27 so as to overlie the central limb 4 of the substrate 1, the limb 28 having a rectangular aperture 29 corresponding to the aperture 14 in the limb 4.

With the spacer 26 in position on the connection substrate 1 the flap 15 is now folded back so as to overlie the spacer 26 and be substantially parallel to the connection substrate 1. The device chip and its bonded connections are now completely protected by the folded over flaps 15 and 16 and the coils 7 and 8 can now be slipped over the substrate 1 as previously described. The spacers 21 and 26 are typically 18 thousandths of an inch thick.

Figure 4:
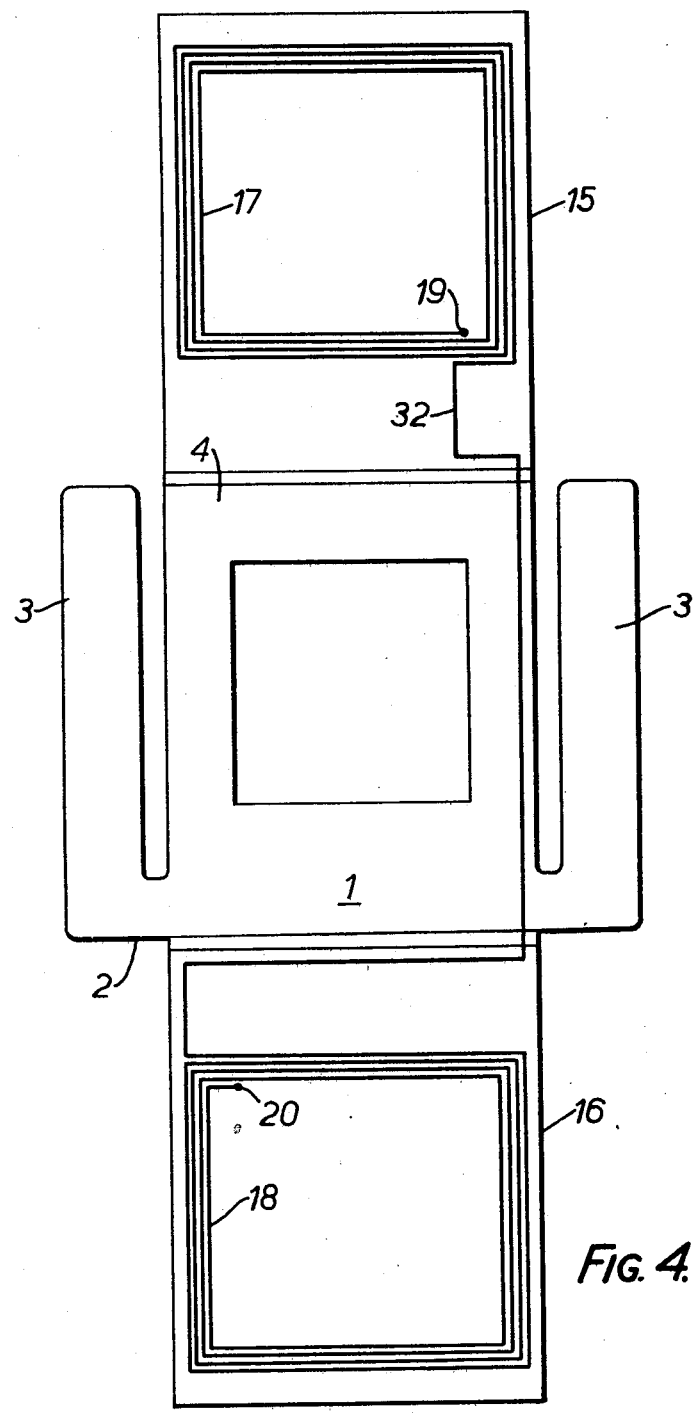

Referring now to FIGS. 3 and 4 these show both sides of the KAPTON film forming the connection substrate 1 and the flaps 15 and 16 FIG. 3 showing that side of the film illustrated in FIG. 2 whilst FIG. 4 shows the reverse side of the film. In FIGS. 3 and 4 like parts to those in FIGS. 1 and 2 their like reference numerals and the Figures are considered to be self explanatory.

In FIG. 3 a printed track 30 connects the coil 17 to the contact pad 11a whilst a printed track 31 connects the coil 18 with the contact pad 11b.

In FIG. 4 a printed track 32 interconnects the coils 17 and 18 provided on the flaps 15 and 16 respectively so that the two coils effectively form a single Z coil.

The invention enables a Z coil to be incorporated within a device package with negligible increase in package size due to the very small thickness of the flexible film substrate which is used to carry the printed Z coil. The advantages of operational flexibility of a Z coil are thus achieved without any increase in package size. This is particularly useful in high storage density bubble memory devices e.g. 256K bits.

The flaps illustrated in the examplary embodiment provide additional protection for the device chip and its bonded connections during assembly of the coils 7 and 8 and this provides a significant advantage by reducing device failure at this stage.

The invention has been described by way of example only and modifications may of course be made without departing from the scope of the invention. In particular the described embodiment has Z coils which are printed on folding flaps but this is not essential and it is possible to provide a printed Z coil on a flexible film substrate which is not attached to the connection substrate 1. In this latter case the connection substrate 1 would not necessarily be formed from the same flexible film material. It is also not essential to provide a coil on both sides of each flap 15, 16, this depending upon the field strength required to be produced.

The described embodiment utilises KAPTON polyimide films but this is not essential Polyester film may also be used.

What I claim is:
1. A magnetic bubble device comprising:
   a chip of material capable of supporting magnetic bubbles, bias means for providing a bias field across the chip, and a substrate having a chip connection portion provided with electrical connections to the chip from a plurality of electrical terminals and a flap portion provided with a printed Z coil thereon for superimposing a test magnetic field onto the bias field, which flap portion is folded back so as to lie substantially parallel to the substrate.

2. A magnetic bubble device as claimed in claim 1, wherein the chip connection substrate is formed from a flexible film substrate.

3. A magnetic bubble device as claimed in claim 1 wherein said chip, said bias means, and said Z coil are encapsulated in a magnetic shield.

4. A magnetic bubble device as claimed in claim 1 wherein said Z coil is printed on both sides of the substrate, said substrate having printed tracks on each side with at least one electrical connection therebetween.

5. A magnetic bubble device as claimed in claim 1, wherein the Z coil means is formed upon two flaps which extend outwardly from opposing edges of the chip connection substrate, electrical connection being made between printed tracks on the two flaps, each flap being arranged to fold back so as to lie, in operation, parallel to the chip connection substrate.

6. A magnetic bubble device as claimed in claim 5, wherein one flap extends outwardly from the centre limb of the E-shaped substrate whilst the other flap of the two flaps extends outwardly from the opposing rear edge of the substrate.

7. A magnetic bubble device as claimed in claim 5, wherein the two flaps fold back towards opposing surfaces of the chip connection substrate.

8. A magnetic bubble device as claimed in claim 7, wherein one flap extends outwardly from the centre limb of the chip connection substrate whilst the other flap of the two flaps extends outwardly from the opposing rear edge of the chip connection substrate.

9. A magnetic bubble device as claimed in claim 1, wherein the chip connection substrate is generally E-shaped having end limbs each spaced from a centre limb, the end limbs and centre limb extending outwardly from a rear edge of the E-shaped substrate.

10. A magnetic bubble device as claimed in claim 9, wherein the chip connection substrate is provided with an aperture in the centre limb for accommodating the chip.

11. A magnetic bubble device as claimed in claim 9, wherein printed tracks are provided on the connection chip substrate to extend between conductive contact pads provided on at least one of the end limbs, and electrical contacts are provided on the centre limb, electrical connection being made between the chip and the contacts on the centre limb.

12. A magnetic bubble device as claimed in claim 11, wherein the chip connection substrate is provided with an aperture in the centre limb for accommodating the chip.

13. A magnetic bubble device as claimed in claim 12, wherein the chip connection substrate is formed from a flexible film substrate.

14. A magnetic bubble device as claimed in claim 13, wherein the Z coil means is formed on a flexible film substrate which is common with the flexible film chip connection substrate.

15. A magnetic bubble device as claimed in claim 14, wherein the flexible film substrate from which the chip connection substrate is formed comprises a polyimide film substrate.

16. A magnetic bubble device as claimed in claim 15, wherein the Z coil means is formed on a flexible film substrate which is common with the flexible film chip connection substrate.

* * * * *